United States Patent [19]
Assadi et al.

[11] Patent Number: 6,150,653
[45] Date of Patent: *Nov. 21, 2000

[54] LENS SYSTEM FOR PHOTODETECTORS

[75] Inventors: Azar Assadi, Tempe; Kannan Raj, Chandler; Robert C. Sundahl, Phoenix, all of Ariz.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/250,910

[22] Filed: Feb. 16, 1999

Related U.S. Application Data

[63] Continuation-in-part of application No. 09/200,239, Nov. 25, 1998.

[51] Int. Cl.$^7$ ........................................... G01J 3/14
[52] U.S. Cl. .............................. 250/216; 250/214.1
[58] Field of Search ................................. 250/208.1, 216, 250/241.1

[56] References Cited

U.S. PATENT DOCUMENTS

| | | | |
|---|---|---|---|
| 4,733,943 | 3/1988 | Suzuki et al. | 359/565 |
| 5,340,978 | 8/1994 | Rostoker et al. | 250/208.1 |
| 5,623,473 | 4/1997 | Ichihara | 369/116 |
| 5,796,514 | 8/1998 | Chipper | 359/354 |

FOREIGN PATENT DOCUMENTS

| | | |
|---|---|---|
| 0 517 409 A1 | 12/1992 | European Pat. Off. . |
| 0 658 418 A1 | 6/1995 | European Pat. Off. . |
| WO 93/21120 | 10/1993 | WIPO . |

OTHER PUBLICATIONS

NEC Corp., "Semiconductor Photodetecting Element," Patent Abstracts of Japan, vol. 014, No. 282 (E–0942), Jun. 19, 1990 and JP 02 090685 A, Mar. 30, 1990.

Mitsubishi Materials Corp., "Fresnel Lens and Its Production," Patent Abstracts of Japan, vol. 1996, No. 03, Mar. 29, 1996 and JP 07 306306 A Nov. 21, 1995.

Matsushita Electric Ind. Co. Ltd., "Optical Device," Patent Abstracts of Japan, vol. 013, No. 043, Jan. 31, 19989 and JP 63 239402 A, Oct. 5, 1998.

Matsushita Electric Ind. Co. Ltd., "Production for Fresnel Lens," Patent Abstracts of Japan, vol. 010, No. 045 (P–430), Feb. 21, 1986 and JP 60 191202 A, Sep. 28, 1985.

*Primary Examiner*—F. L. Evans
*Attorney, Agent, or Firm*—Trop, Pruner & Hu, P.C.

[57] ABSTRACT

An photosensitive device may be formed with a diffractive lens which offsets chromatic aberrations and dispersion caused by a refractive capture lens. The diffractive lens may be formed of a sol-gel material having a photoinitiator, or other materials including those that may be defined with low temperature techniques commonly used in connection with photoresist.

1 Claim, 2 Drawing Sheets

LENS SYSTEM FOR PHOTODETECTORS

CROSS-REFERENCE TO RELATED APPLICATION

This is a continuation-in-part of patent application Ser. No. 09/200,239, filed on Nov. 25, 1998.

BACKGROUND

This invention relates generally to lenses and to photodetectors which may be used, for example, for digital imaging devices including cameras and scanners.

Photodetectors are used to detect light in a digital imaging device. A large number of photodetectors may each detect a light intensity value for a given pixel. These light intensity values are digitized and used to form a digital depiction of a particular image. Such imaging devices are used in digital cameras, scanners and other devices.

The imaging device may be formed, for example, using complementary metal oxide semiconductor (CMOS) technology. Imaging devices made using CMOS technology include active pixel sensors (APS) and passive pixel sensors (PPS). Alternatively, the imaging device may use charge coupled device (CCD) technology. All of these devices can be made of particularly small size.

Imaging arrays of particularly small size may have a fill factor problem. The fill factor is the fraction of the total amount of light that falls on any given pixel.

Ideally, the amount of light that falls on each photodetector is designed to be as high as possible to improve the signal to noise ratio. In order to improve the fill factor with small photodetectors, a microlens may be situated over the photodetector. The microlens focuses all the light incident on a pixel onto the photodetector and therefore improves the fill factor of the photodetector.

Conventional lens systems used in imaging devices employ high quality refractive lenses which are more expensive. These lenses, with high numerical apertures, may be used to reduce chromatic aberrations and dispersion.

Dispersion and chromatic aberrations result in focal shifts that affect different colors (i.e. different wavelengths of is light) differently. Dispersion, may be measured and expressed as an Abbe or V number. Even with expensive refractive lenses focal length variations due to temperature and wavelength may degrade performance.

Therefore, it would be desirable to have a lens system with improved characteristics.

SUMMARY

In accordance with one embodiment, a photodetector includes a diffractive lens element. A photosensitive device is arranged to receive light through the lens element. A refractive lens is placed in series with the diffractive lens element.

DETAILED DESCRIPTION

Figure 1:
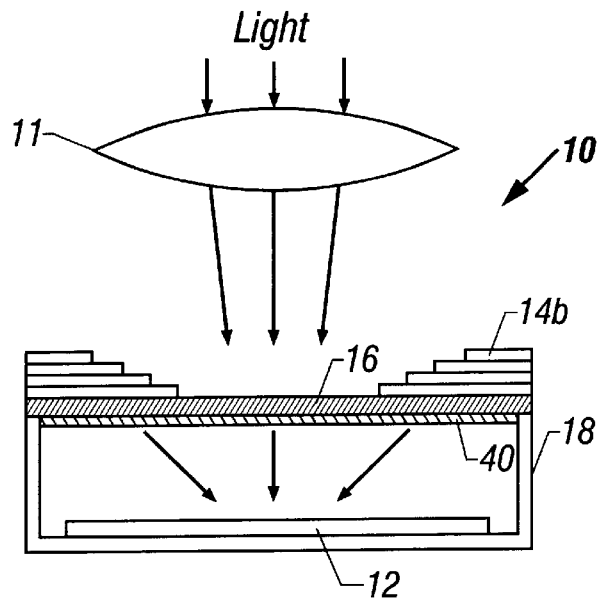
FIG. 1 is an enlarged cross-sectional view taken vertically through a photodetector in accordance with one embodiment of the present invention.

A packaged photosensitive device 10, shown in FIG. 1, may include a photodetector 12 which converts an input light signal into an analog signal carrying information about the intensity of the light incident on the photodetector. The signal from a photodetector, including a plurality of pixels, can be digitized to prepare a digital recreation of the exposed image. This digital representation may then be used in digital cameras and scanners and other imaging devices to reproduce a representation of the exposed scene.

Centered on top of the photodetector 12 array is a diffractive lens 14. Lens elements 14a and 14b diffract light so that more light falls on the exposed, underlying photodetector 12. In addition, the lens 14 may counteract or correct the positive dispersion and chromatic aberration caused by the refractive capture or taking lens 11. The diffractive lens 14 helps remove the stringent requirement of high numerical aperture on the refractive lens.

The photodetector 12 may be contained in a package 18 including a substantially light transmissive window 16. Light refracted by a refractive lens 11 may be diffracted by the lens 14 before falling on the photodetector 12. For example, the lens 14 may be secured to the window 16 or it may be formed as part of the window 16.

Figure 4:
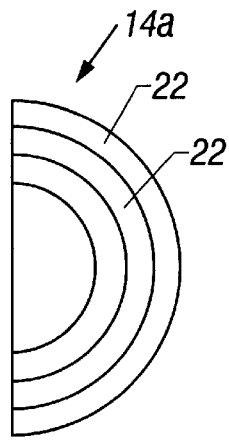
FIG. 4 is a top plan view of a diffractive element shown in FIG. 1.

Referring to FIG. 4, the lens 14 may be symmetrical and semi-circular in shape viewed from above and may have an overall pyramidal configuration. The lens 14 may be formed of a plurality of steps 22 which may create a stepped configuration when viewed from the side, as illustrated in FIG. 1. While four steps are shown in the illustrated embodiment, the number of steps is subject to considerable variability and would depend on the design of a particular photosensitive array.

The effect of the lens 14 is to receive and diffract incident light, thereby collecting additional light which may be focused on the photodetector 12. This improves the effective fill factor of the photodetector 12 improving the light collection efficiency of the pixels in the array 12.

An array of diffractive microlenses 40 may be formed, for example on the opposite side of the window 16, to focus light on each of the pixels making up the photodetector 12. The microlenses 40 may be formed using the same techniques used to form the lens 14. Alignment marks on the window 16 and photodetector 12 may be used to align the microlenses 40 with the pixels of the photodetector 12. Other optical alignment techniques may be used as well.

The effective focal length of the system 10 may be determined using the following equation:

$$1/F_{eff} = 1/F_R + 1/F_D - D/F_R F_D$$

where:

$F_R$ is the refractive lens 11 focal length $F_D$ is the diffractive lens 14 focal length, and D is the distance between the lenses. The F-number of the composite system is simply the effective focal length (Feff) divided by the diameter of the lenses.

Figure 2:
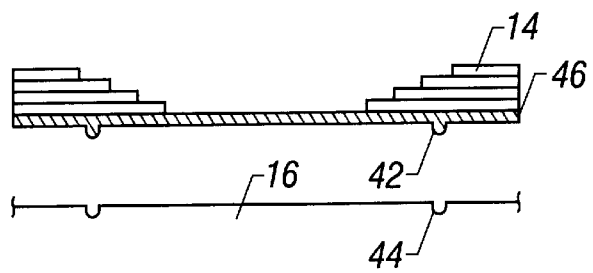
FIG. 2 is an enlarged exploded cross-section view of another embodiment of the present invention.

Referring now to FIG. 2, the diffractive lens 14 may be mounted on a carrier 46. The carrier 46 may include alignment pins 42 which mate with notches 44 in the window 16. In this way, the diffractive lens 14 may be accurately aligned with the window 16 and thereby with the photodetector 12. Other alignment systems may be used as well, including the use of alignment marks on the window and the carrier 46.

The diffractive lens 14 may also be formed on or as part of the refractive lens 11 or another structure instead of being associated with the window 16. Generally, the lenses 11 and 14 are arranged in series with one another and the microlenses 40, if provided.

Figure 3:
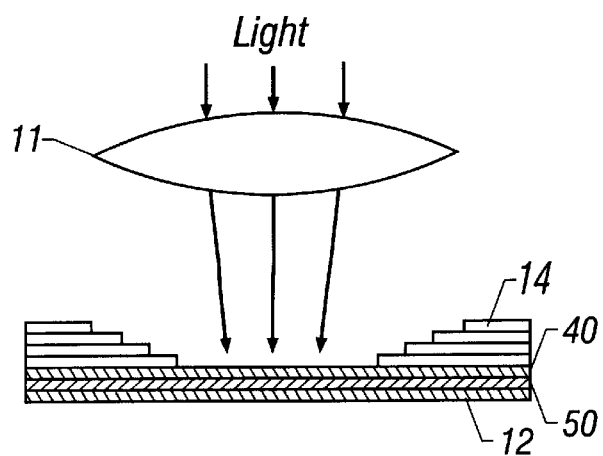
FIG. 3 is an enlarged vertical cross-sectional view of still another embodiment of the present invention.

Referring next to FIG. 3, in still another embodiment, the diffractive lens 14 may be formed on the photodetector 12. In such case, the refractive lens 11 may be on the outside of the package and a package window (not shown) may be positioned between the lens 11 and the diffractive lens 14. The diffractive lens 14 may then be mounted on microlenses 40 which in turn are positioned over a color filter array (CFA) 50, in one embodiment of the present invention.

One advantageous material for forming the lens 14 (and the microlenses 40) is a sol-gel hybrid glass. Advantageous sol-gel hybrid glasses for use in the present invention may be formed using low temperature formation processes. Thus, the glasses may be shaped and formed using techniques comparable to those utilized in connection with forming photoresists. That is, UV light may be used to expose a portion of the sol-gel material and to develop that material so that the remaining portion may be removed. Also, the sol-gel may exhibit advantageous transmissivities compared to conventional materials used to form lenses.

Sol-gel glasses may be formed, for example, by hydrolysis of tetraethylorthosilicate (TEOS) and/or tetramethylorthosilicate (TMOS). After hydrolysis, these materials may be subjected to oxolation or oxygen bridge formation and polycondensation. The result is a silicon is oxide complex which is solvent swollen to form a polymerized network. If a photoinitiator is included in the complex, the material may be shaped using conventional photoresist patterning techniques.

In accordance with one embodiment, a sol-gel hybrid glass can be prepared by hydrolysis polycondensation of the methacrylate group substituted silane in the presence of water. The gel synthesis happens, allowing the methylacryloxypropyl trimethoxysilane or glysidoxypropyltrimethylsilane precursor material to react with diluted acid or base water solution, for example, in a molar ratio of 1:2 respectively for several hours.

Before spin coating, propriety amounts of 1-hydroxycyclohexyl phenyl ketone may be added as a photoinitiator to initiate polymerization of unsaturated glass hybrid polymer.

In one embodiment, the gel may be filtered by a 0.1 millimeter filter to remove aggregated polymer particles and to form a film with good surface quality. Films may then be then deposited on top of window 16 to or on other substrates and pre-baked, for example, at 60° C. for 15 minutes, in one embodiment. The resulting film thickness is adjustable by varying spinning speed and use of solvents such as methanol, ethanol or xylene.

Figure 5:
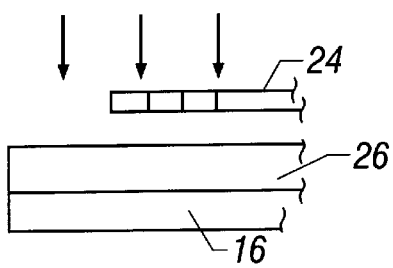
FIG. 5 shows the UV light exposure step used in one method of forming the device as shown in FIG. 1.
Figure 6:
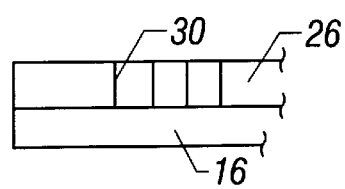
FIG. 6 shows the result of the UV light exposure step illustrated in FIG. 5.
Figure 7:
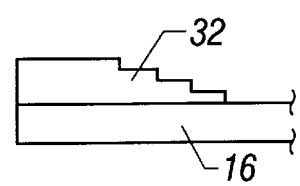
FIG. 7 shows the structure that results from developing the structure shown in FIG. 6.

The spin coated films may be exposed by a mercury UV lamp or other light source through an opening in a photomask, for example, for 1 to 30 minutes, in one embodiment, to form patterns, as shown in FIG. 5. In particular, a UV mask 24 may be situated over the hybrid sol-gel 26 located over the window 16 to create a graded exposure pattern in the sol-gel 26 as indicated by lines 30 in FIG. 6. The patterned structure 28 may be obtained by developing the sol-gel 26 in a developer, such as isopropanol, to remove unexposed parts of the sol-gel to form the steps 22, as shown in FIG. 7. After this removal step, the film may be postbaked, for example, at 100° to 200° C. for 10 to 60 minutes or less, in one embodiment, to harden the film.

The sol-gel 26 may be formed into a plurality of discrete layers having distinct optical properties. Each layer or combination of layers may form a different step 22, as indicated in FIG. 7.

If particular material properties are necessary, titanium, silicon or zirconium, or the prehydrolysed alkoksides of these materials can be added to the solution of the methacrylate group substituted silanes. For example, titanium (IV)-propoxide and zirconium (IV)-propoxide may be used. Methacrylic acid may be used to prevent zirconium propoxide precipitation.

To produce the lens shape shown in FIG. 4, a gray scale mask may be used. See Suleski, T. J. and Oshea, D. C. 1995, "Gray Scale Mask For Diffractive Optics Fabrication," Appl. Optics 34, 7507. A conventional mask material, which may be quartz or glass, is coated conventionally with chromium. In this way the sol-gel may be deposited and patterned at a temperature of less than 200° C.

Figure 8:
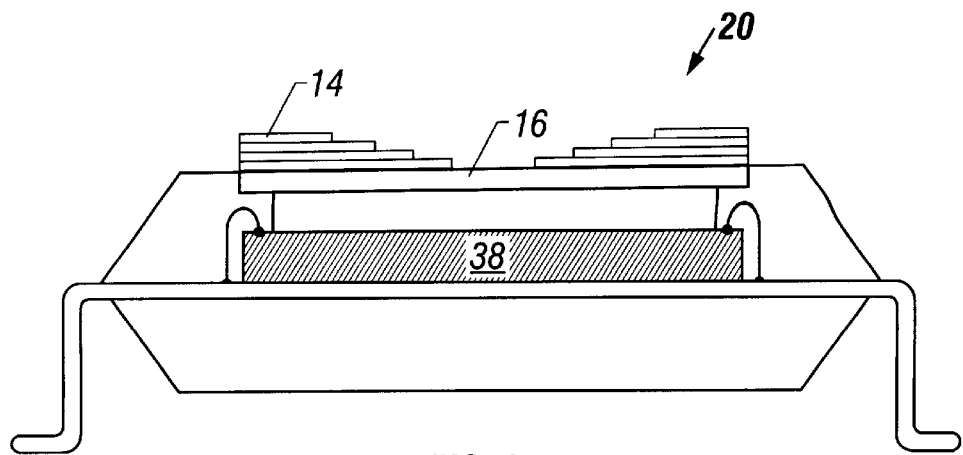
FIG. 8 is an enlarged cross-sectional view of a package for an integrated circuit package in accordance with one embodiment the present invention.

The window 16 may be formed in the package 20 containing an integrated circuit imaging die 38, as shown in FIG. 8. The lens 14 may be formed on the outside of the package window 16. A photodetector 12 may be formed on the die 38; however, the die may in some embodiments may include other components as well, such as a microprocessor as one example. The package 20 is positioned with the window 16 in optical alignment with a refractive capture or taking lens (not shown in FIG. 8).

Alternatively, an optically clear, stable positive photoresist may be used to form the lens 14 using low temperature processing conventionally used with photoresists in semiconductor manufacturing processes. For example, MFR-324 made by JSR Microelectronics, Inc., Sunnyvale, Calif., may be used to form the lens.

While the present invention has been described with respect to a limited number of embodiments, those skilled the art will appreciate numerous modifications and variations therefrom. It is intended that the appended claims cover all such modifications and variations which fall within the true spirit and scope of the present invention.

What is claimed is:

1. A photodetector comprising:

a packaged photosensitive device;

a diffractive lens arranged on said packaged photosensitive device, said lens formed of a sol-gel material including a photoinitiator, said lens having a stepped configuration including a plurality of surfaces stacked one upon the other; and a window formed over said packaged photosensitive device, said lens being formed over said window.

* * * * *